(12) United States Patent
Sekiguchi et al.

(10) Patent No.: US 8,537,259 B2
(45) Date of Patent: Sep. 17, 2013

(54) PHOTOELECTRIC CONVERSION CIRCUIT AND SOLID STATE IMAGING DEVICE INCLUDING SAME

(75) Inventors: Hiroshi Sekiguchi, Kyoto (JP); Takaaki Fuchikami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 903 days.

(21) Appl. No.: 12/597,204

(22) PCT Filed: Aug. 18, 2008

(86) PCT No.: PCT/JP2008/064682
§ 371 (c)(1),
(2), (4) Date: Oct. 23, 2009

(87) PCT Pub. No.: WO2009/028343
PCT Pub. Date: Mar. 5, 2009

(65) Prior Publication Data
US 2010/0123812 A1    May 20, 2010

(30) Foreign Application Priority Data

Aug. 31, 2007    (JP) .................................. 2007-226559

(51) Int. Cl.
*H04N 5/335* (2011.01)

(52) U.S. Cl.
USPC ............................ 348/308; 348/294; 348/297

(58) Field of Classification Search
USPC ........................................... 348/308, 294, 297
See application file for complete search history.

(56) References Cited

U.S. PATENT DOCUMENTS

| 5,619,262 | A * | 4/1997 | Uno .............................. 348/297 |
| 6,798,250 | B1 * | 9/2004 | Wile ............................... 327/51 |
| 6,831,691 | B1 | 12/2004 | Takada et al. |
| 2005/0117042 | A1 | 6/2005 | Hirotsu et al. |

FOREIGN PATENT DOCUMENTS

| JP | 11-298798 | 10/1999 |
| JP | 2002-171142 | 6/2002 |
| JP | 2004-159155 | 6/2004 |
| JP | 2005-160031 | 6/2005 |
| JP | 2008-141737 | 6/2008 |

* cited by examiner

*Primary Examiner* — Tuan Ho
*Assistant Examiner* — Quang Le
(74) *Attorney, Agent, or Firm* — Fish & Richardson P.C.

(57) ABSTRACT

A photoelectric conversion circuit includes: a photoelectric conversion element having one end to which bias voltage is applied and the other end from which photo current according to an amount of received light is output; and a photo current detecting unit clamping voltage of the other end of the photoelectric conversion element to a predetermined potential and detecting the photo current.

9 Claims, 5 Drawing Sheets

PHOTOELECTRIC CONVERSION CIRCUIT AND SOLID STATE IMAGING DEVICE INCLUDING SAME

TECHNICAL FIELD

The present invention relates to a photoelectric conversion circuit and a solid state imaging device including the photoelectric conversion circuit.

BACKGROUND ART

FIG. 8 is a circuit diagram showing one exemplary conventional CMOS (Complementary Metal Oxide Semiconductor) photoelectric conversion circuit (so-called CMOS sensor).

In the CMOS sensor shown in FIG. 8, a photodiode 71 has an anode connected to a ground end. Photodiode 71 has a cathode connected to one end of a switch 74. The other end of switch 74 is connected to one end of a capacitor 72, the gate of an N-channel field-effect transistor 73, and one end of a switch 75. The other end of capacitor 72 is connected to a ground end. The other end of switch 75 is connected to an end to which power source voltage VDD is applied. Transistor 73 has a drain connected to an end to which power source voltage VDD is applied. Transistor 73 has a source connected to one end of a switch 76. The other end of switch 76 is connected to a received-light signal output line 77.

FIG. 9 is a vertical cross sectional view showing a device structure of the exemplary conventional CMOS photoelectric conversion circuit.

In the CMOS sensor shown in FIG. 8 and FIG. 9, upon its initialization, switch 74 is brought into the off state, and switches 75, 76 are both brought into the on state. By controlling the switches in this way, capacitor 72 is charged by charging current iy flowing via switch 75, thus increasing terminal voltage Vc thereof to a predetermined initial voltage level (i.e., fully charged level of capacitor 72). As a result, transistor 73 is reset to the initial state (full-on state) and output current iz flowing in received-light signal output line 77 has a maximal value.

Upon exposure of photodiode 71 after the initialization of the CMOS sensor, switch 74 is brought into the on state, and switches 75, 76 are both brought into the off state. By controlling the switches in this way, capacitor 72 is discharged by photo current ix obtained according to an amount of light received by photodiode 71, thus decreasing terminal voltage Vc thereof from the initial voltage level. As a result, depending on the amount of light received by photodiode 71, transistor 73 is brought into a more closed state (state in which on-resistance is increased and conductivity is decreased) than the initial state.

Upon reading of a received-light signal after the exposure of photodiode 71, switches 74, 75 are both brought into the off state and switch 76 is brought into the on state. By controlling the switches in this way, output current iz is drawn from received-light signal output line 77 in accordance with the conductivity of transistor 73 (i.e., the amount of light received by photodiode 71). Hence, the amount of light received by photodiode 71 can be detected based on an amount of reduction of output current iz.

As one example of conventional techniques associated with the above, Japanese Patent Laying-Open No. 2002-171142 (Patent Document 1), provided by the applicant of the present application, discloses the following technique. That is, it includes: a photoelectric conversion unit that generates current according to intensity of incident light; a logarithmic conversion unit that generates voltage through logarithmic conversion of the current generated by the photoelectric conversion unit; an offset unit that shifts by a predetermined value the voltage generated by the logarithmic conversion unit; a field-effect transistor having a gate and a source between which the voltage obtained by the logarithmic conversion unit and the voltage obtained by the offset unit are applied; and a current/voltage conversion unit that allows drain current of the transistor to flow in a resistor to convert it into voltage.

Japanese Patent Laying-Open No. 2004-159155 (Patent Document 2), also provided by the applicant of the present application, discloses the following technique: an area image sensor having a multiplicity of pixels forming pixel rows/pixel columns. As components of each of the pixels, the area image sensor includes: a photoelectric conversion element; a reset transistor that enables/disables a pixel signal of the photoelectric conversion element; a sense amplifier that amplifies the enabled pixel signal and outputs it; and a switching transistor that switches on/off the operation of the sense amplifier. In each of the pixels, the area image sensor includes: at least one capacitor provided between the photoelectric conversion element and the reset transistor to temporarily store the pixel signal; and at least one transfer transistor provided between the photoelectric conversion element and the capacitor to transfer the pixel signal to the capacitor and switch on/off for the transferring.

Patent Document 1: Japanese Patent Laying-Open No. 2002-171142

Patent Document 2: Japanese Patent Laying-Open No. 2004-159155

DISCLOSURE OF THE INVENTION

Problems to be Solved by the Invention

Certainly, the conventional CMOS sensor shown in FIG. 8 can be manufactured with much lower cost as compared with a CCD (Charge Coupled Devices) sensor. In addition, the element is small and operates with a single low voltage. Hence, in recent years, the CMOS sensor is provided in various applications such as a mobile phone terminal with a camera function, and a so-called web camera.

To realize improved light-receiving sensitivity and improved S/N ratio (Signal to Noise Ratio) of the received-light signal in the CMOS sensor, a technique utilizing an avalanche multiplier effect of the photoelectric conversion element is employed. The avalanche multiplier effect is to obtain a large photo current by inducing a so-called "electron avalanche phenomenon". The electron avalanche phenomenon is induced by feeding the photoelectric conversion element with high reverse bias voltage (several tens to several hundreds [V]) around its breakdown voltage so as to widen a depletion layer and increase field intensity.

It should be noted that the amplification factor of the photo current in the avalanche multiplier effect changes exponentially relative to the reverse bias voltage. Hence, in order to utilize the avalanche multiplier effect, it is necessary to steadily apply high reverse bias voltage to the photoelectric conversion element.

However, in the conventional CMOS sensor shown in FIG. 8, the cathode potential of photodiode 71 is varied depending on the amount of charge accumulated in capacitor 72. This causes variation of the bias voltage for photodiode 71. Accordingly, arbitrary bias voltage cannot be applied thereto steadily and the above-described avalanche multiplier effect cannot be utilized.

Where the avalanche multiplier effect is not utilized, it is also desirable to steadily apply arbitrary bias voltage to the photodiode.

The conventional technique of Patent Document 1 provides a circuit that employs an offset power source for logarithmic conversion, rather than a current mirror circuit. In this regard, the conventional technique is different in its essential configuration from the invention of the present application.

In view of the above-described problems, an object of the present invention is to provide a photoelectric conversion circuit that is capable of steadily applying arbitrary bias voltage to a photoelectric conversion element, and a solid state imaging device including the photoelectric conversion circuit.

Means for Solving the Problems

A photoelectric conversion circuit according to a certain aspect of the present invention includes: a photoelectric conversion element having one end to which bias voltage is applied and the other end from which photo current according to an amount of received light is output; and a photo current detecting unit clamping voltage of the other end of the photoelectric conversion element to a predetermined potential and detecting the photo current.

Preferably, the photo current detecting unit is a current mirror circuit that has an input end connected to the other end of the photoelectric conversion element, that clamps the voltage of the other end of the photoelectric conversion element to the predetermined potential, and that generates mirror current according to the photo current.

More preferably, the current mirror circuit is a cascode current mirror circuit.

More preferably, the current mirror circuit has a plurality of mirror stages, and combines respective currents generated by the mirror stages, so as to generate the mirror current.

More preferably, the photoelectric conversion circuit further includes a current/voltage conversion unit converting the mirror current into voltage.

More preferably, the current/voltage conversion unit includes a capacitor having one end which is connected to an output end of the current mirror circuit and from which terminal voltage according to an integral of the mirror current is drawn.

More preferably, the capacitor is a MOS capacitor having a gate connected to the output end of the current mirror circuit.

More preferably, the photoelectric conversion circuit further includes an amplifier generating an amplified signal according to the terminal voltage of the capacitor, wherein based on the amplified signal generated by the amplifier, a final received-light signal is output.

More preferably, the photoelectric conversion circuit further includes: a first switch that is connected between the one end of the capacitor and an end to which reference voltage is applied and that is turned on/off in response to a reset signal; and a second switch that is connected between an output end of the amplifier and an output line and that is turned on/off in response to a read signal.

More preferably, the amplifier is a source follower circuit that employs a field-effect transistor having a gate receiving the terminal voltage of the capacitor and having a source from which output current is drawn.

A solid state imaging device according to a certain aspect of the present invention includes: a plurality of photoelectric conversion circuits; and a selection circuit selecting at least one of the plurality of photoelectric conversion circuits and acquiring a light detection result of the photoelectric conversion circuit thus selected, each of the photoelectric conversion circuits including: a photoelectric conversion element having one end to which bias voltage is applied and the other end from which photo current according to an amount of received light is output; and a photo current detecting unit clamping voltage of the other end of the photoelectric conversion element to a predetermined potential and detecting the photo current.

Effects of the Invention

In accordance with a photoelectric conversion circuit according to the present invention and a solid state imaging device including the photoelectric conversion circuit, arbitrary bias voltage can be applied steadily to the photoelectric conversion element. Hence, improved light receiving sensitivity and improved S/N ratio of a received-light signal can be realized using the avalanche multiplier effect.

DESCRIPTION OF THE REFERENCE SIGNS

1: sensor array; 2: row decoder; 3: column decoder; P11-Pmn: pixel sensor (photoelectric conversion circuit); X1-Xm: row selection line; Y1-Yn: column selection line; S: received-light signal output line; Q1-Qn: column selection switch (N-channel field-effect transistor); PD: photo detector (photoelectric conversion element); N1-N10: N-channel field-effect transistor; P1-P8: P-channel field-effect transistor; Id: photo current; Im: mirror current; Io: output current; Vo: output voltage; VDD: power source voltage; VDDPD: bias voltage; RST: reset signal; RD: read signal.

BEST MODES FOR CARRYING OUT THE INVENTION

The following description exemplifies a case where a photoelectric conversion circuit is used as a light receiving unit (pixel sensor) of a solid state imaging device provided in a mobile phone terminal with a camera function, a web camera, or the like.

First Embodiment

Figure 1:
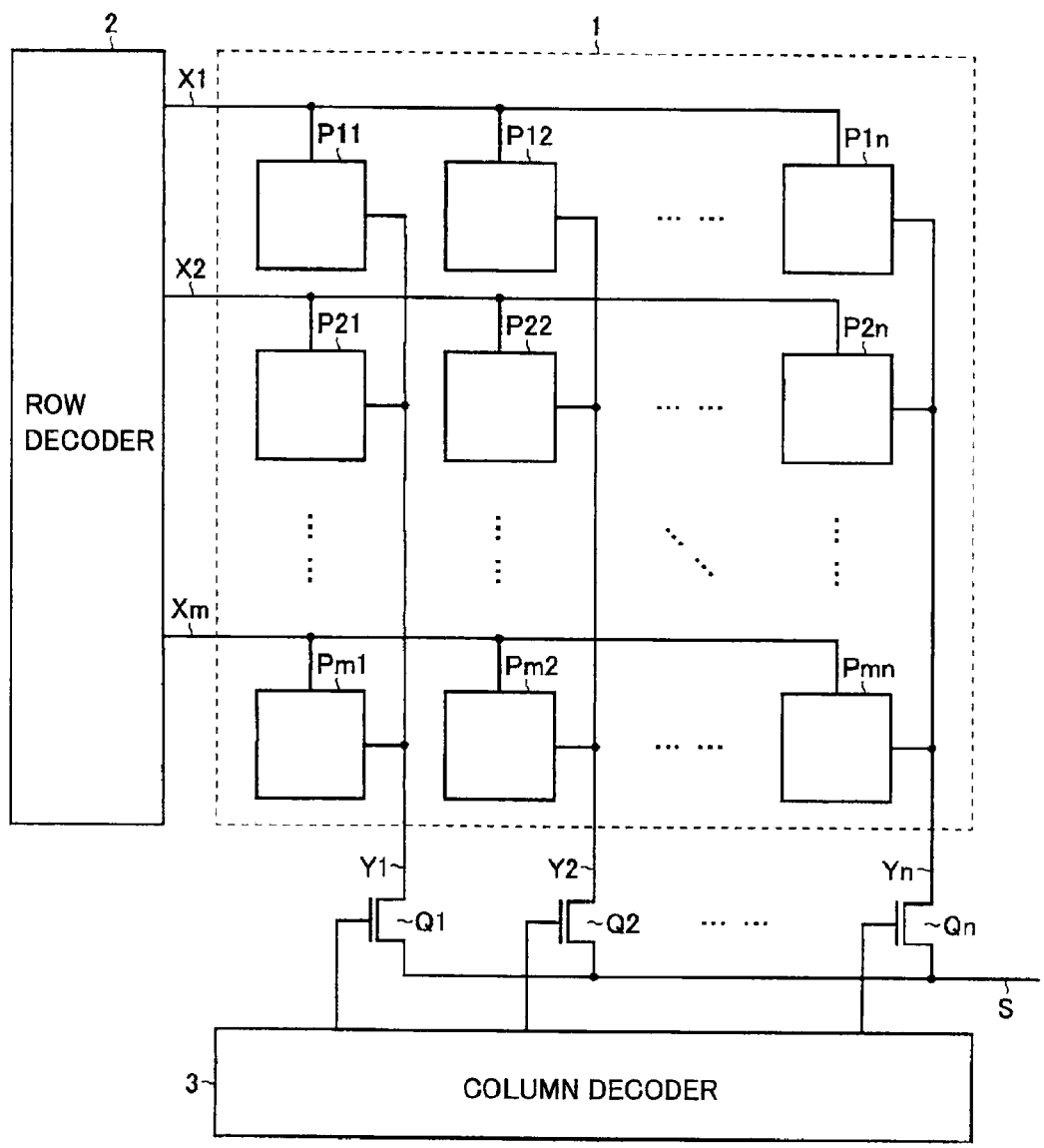
FIG. 1 is a block diagram showing a schematic configuration of a solid state imaging device according to a first embodiment of the present invention.

FIG. 1 is a block diagram showing a schematic configuration of a solid state imaging device according to a first embodiment of the present invention.

As shown in FIG. 1, solid state imaging device 101 includes a sensor array 1, a row decoder 2, and a column decoder 3.

Sensor array 1 has a two-dimensional matrix structure in which row selection lines X1-Xm and column selection lines Y1-Yn are arranged in the horizontal and vertical directions respectively and pixel sensors are provided respectively at intersections of these signal lines. Accordingly, sensor array 1 has m×n pixel sensors P11-Pmn in total (each of m, n is an integer equal to or greater than 2). In addition to row selection lines X1-Xm and column selection lines Y1-Yn, a power source voltage line, a ground voltage line, various clock lines, a bias voltage line, and the like are connected to sensor array 1, although they are not explicitly shown in FIG. 1. Configurations and operations of pixel sensors P11-Pmn will be described in detail below.

Each of row decoder 2 and column decoder 3 selects at least one of the plurality of pixel sensors in sensor array 1 and acquires a light detection result of the selected pixel sensor.

More specifically, through row selection lines X1-Xm, row decoder 2 controls opening and closing of a row selection switch (in FIG. 2 mentioned below, a transistor N8 corresponds to the row selection switch) provided in each of pixel sensors P11-Pmn, in order to scan sensor array 1 vertically.

Column decoder 3 controls opening and closing of column selection switches Q1-Qn respectively provided for column selection lines Y1-Yn, in order to scan sensor array 1 horizontally. Column selection switches Q1-Qn are constituted by N-channel field-effect transistors, each of which has a drain connected to column selection lines Y1-Yn, has a source connected to a final received-light signal output line S, and has a gate connected to column decoder 3.

Now, the configuration and operation of pixel sensor (photoelectric conversion circuit) Pmn will be described in detail.

Figure 2:
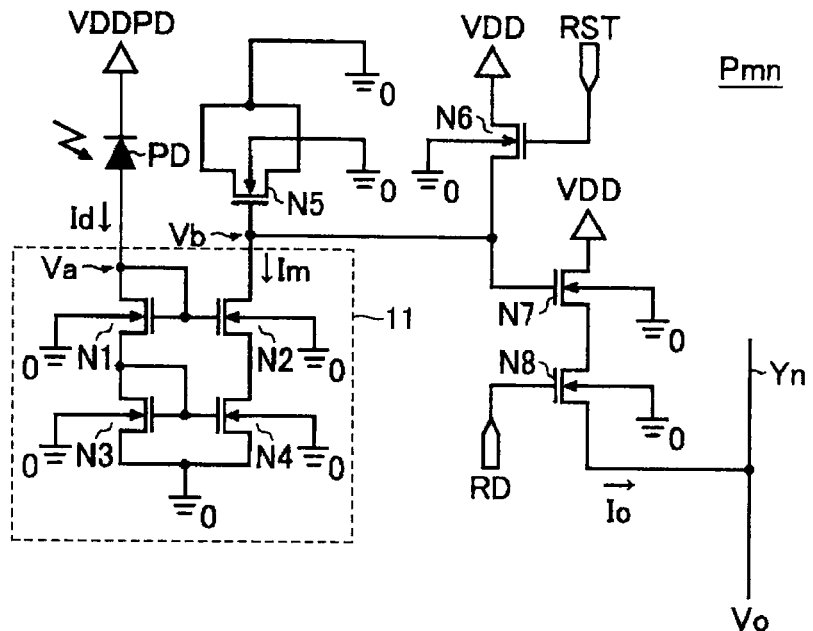
FIG. 2 is a circuit diagram showing a configuration of a pixel sensor Pmn (common cathode) according to the first embodiment of the present invention.
Figure 3:
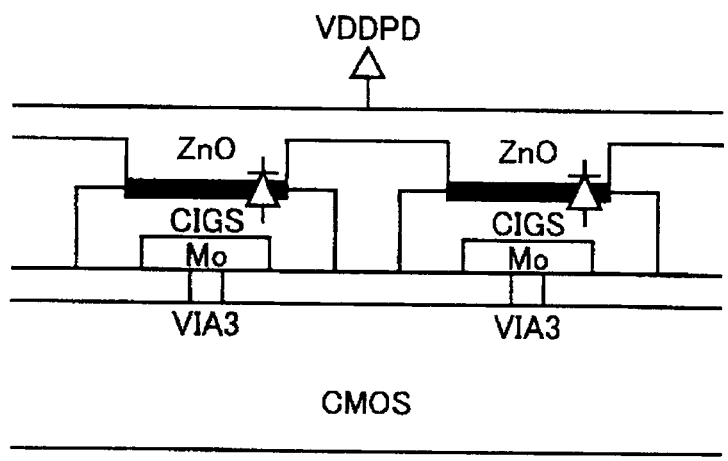
FIG. 3 is a vertical cross sectional view showing a device structure of a photo detector PD.

FIG. 2 is a circuit diagram showing the configuration of pixel sensor Pmn (common cathode) according to the first embodiment of the present invention. FIG. 3 is a vertical cross sectional view showing a device structure of a photo detector PD.

As shown in FIG. 2, pixel sensor Pmn of the present embodiment includes photo detector PD, a current mirror circuit 11, and N-channel field-effect transistors N5-N8. Current mirror circuit 11 includes N-channel field-effect transistors N1-N4.

Photo detector PD is a photoelectric conversion element having a cathode to which bias voltage VDDPD (positive voltage of several tens to several hundreds [V]) is applied and an anode from which photo current Id according to an amount of received light is output. In pixel sensor Pmn of the present embodiment, a CIGS (Copper Indium Gallium Diselenide) solar cell (photodiode) having the device structure of FIG. 3 is used as photo detector PD. Photo detector PD is layered over a CMOS circuit and is connected to the CMOS circuit through a viahole (VIA3). Thus, unlike a configuration that employs a silicon photodiode, the CMOS circuit can be designed without consideration of an occupation area of photo detector PD.

Transistor N1 has a drain connected to the anode of photo detector PD. Transistors N1, N2 have gates connected to each other, and the connection node thereof is connected to the drain of transistor N1. Transistor N1 has a source connected to the drain of transistor N3. Transistor N2 has a source connected to the drain of transistor N4. Transistors N3, N4 have gates connected to each other, and the connection node thereof is connected to the drain of transistor N3. Transistors N3, N4 have sources each connected to a ground end. Transistors N1-N4 have back-gates each connected to a ground end.

Namely, in pixel sensor Pmn of the present embodiment, transistors N1-N4 are used to form cascode current mirror circuit 11 that has an input end connected to the anode of photo detector PD so as to clamp anode voltage Va of photo detector PD to a predetermined potential (2×Vth) and that generates mirror current Im according to photo current Id. It should be noted that parameter Vth described above represents the on-threshold voltage of each of transistors N1-N4.

Transistor N5 has a gate connected to the drain of transistor N2. Transistor N5 has a source and a drain, each of which is connected to a ground end. Transistor N5 has a back-gate connected to a ground end.

Namely, in pixel sensor Pmn of the present embodiment, transistor N5 is used to form a MOS capacitor having one end which is connected to the output end (end from which mirror current Im is drawn) of current mirror circuit 11 and from which terminal voltage Vb according to an integral of mirror current Im is drawn. In the description below, transistor N5 is called MOS capacitor N5 as appropriate.

Transistor N6 has a drain connected to an end to which power source voltage VDD is applied. Transistor N6 has a source connected to one end (gate) of MOS capacitor N5. Transistor N6 has a gate connected to an end to which a reset signal RST is applied. Transistor N6 has a back-gate connected to a ground end.

Namely, in pixel sensor Pmn of the present embodiment, transistor N6 is used to form a first switch that is connected between the one end (gate) of MOS capacitor N5 and the end to which power source voltage VDD is applied and that is turned on/off in response to reset signal RST.

Transistor N7 has a drain connected to an end to which power source voltage VDD is applied. Transistor N7 has a gate connected to the one end (gate) of MOS capacitor N5. Transistor N7 has a back-gate connected to a ground end.

Namely, in pixel sensor Pmn of the present embodiment, transistor N7 having its gate to which terminal voltage Vb of MOS capacitor N5 is input is used to form an amplifier (source follower circuit) that generates an amplified signal (output current Io) according to terminal voltage Vb of MOS capacitor N5.

Transistor N8 has a drain connected to the source of transistor N7. Transistor N8 has a source connected to column selection line (output line) Yn. Transistor N8 has a gate connected to an end to which a read signal RD is applied. Transistor N8 has a back-gate connected to a ground end.

Namely, in pixel sensor Pmn of the present embodiment, transistor N8 is used to form a second switch that is connected between the source of transistor N7 (the output end of the amplifier) and output line Yn and that is turned on/off in response to read signal RD.

Next, the operation of pixel sensor Pmn having the above configuration will be described in detail with reference to FIG. 4.

Figure 4:
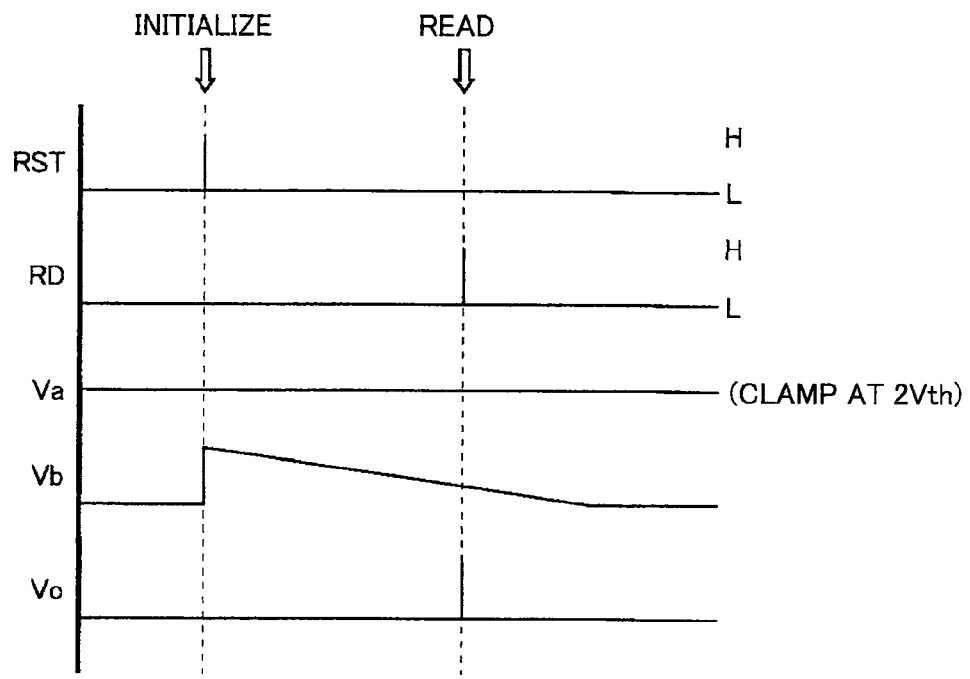
FIG. 4 is a timing chart illustrating an operation of pixel sensor Pmn.

FIG. 4 is a timing chart illustrating the operation of pixel sensor Pmn.

FIG. 4 shows respective behaviors of reset signal RST, read signal RD, anode voltage Va of photo detector PD, terminal voltage Vb of MOS capacitor N5, and output voltage Vo (voltage signal obtained through current/voltage conversion of output current Io) in this order.

In pixel sensor Pmn having the above-described configuration, upon its initialization, reset signal RST rises to the high level and transistor N6 (first switch) is brought into the on state. On the other hand, read signal RD is maintained at the low level and transistor N8 (second switch) is therefore in the off state. Accordingly, the one end (gate) of MOS capacitor N5 is connected via transistor N6 to the end to which power source voltage VDD is applied, thus increasing terminal voltage Vb to the predetermined initial voltage level (almost as large as power source voltage VDD). As a result, transistor N7 is reset to its initial state (full-on state).

Upon exposure of photo detector PD after the initialization of pixel sensor Pmn, reset signal RST falls to the low level again and transistor N6 is brought into the off state. Read signal RD is still maintained at the low level and transistor N8 is therefore in the off state. Accordingly, MOS capacitor N5 is discharged by mirror current Im drawn to current mirror circuit 11, thus decreasing terminal voltage Vb thereof from the initial voltage level. As a result, depending on the amount of light received by photo detector PD, transistor N7 is brought into a more closed state (state in which the on-resistance is high and the conductivity is decreased) than the initial state.

Upon reading of the received-light signal after the exposure of photo detector PD, read signal RD rises to the high level and transistor N8 (second switch) is brought into the on state. On the other hand, reset signal RST is still maintained at the low level and transistor N7 (first switch) is therefore in the off state. Accordingly, the source of transistor N7 is brought into connection with column selection line (output line) Yn via transistor N8. As a result, output current Io is drawn from column selection line (output line) Yn in accordance with the conductivity of transistor N7 (i.e., the amount of light received by photo detector PD), and output voltage Vo according to output current Io thus drawn is obtained. By detecting it, the amount of light received by photo detector PD can be found. Specifically, as the amount of light received by photo detector PD is greater, output current Io (output voltage Vo accordingly) is decreased.

As described above, pixel sensor Pmn of the present embodiment includes: photo detector PD having its cathode to which bias voltage VDDPD is applied and its anode from which photo current Id according to the amount of received light is output; current mirror circuit 11 (N1-N4) that has the input end connected to the anode of photo detector PD, that clamps anode voltage Va of photo detector PD to the predetermined potential (2×Vth) and that generates mirror current Im according to photo current Id; MOS capacitor N5 having the one end which is connected to the output end of current mirror circuit 11 (end from which mirror current Im is drawn) and from which terminal voltage Vb according to the integral of mirror current Im is drawn; and amplifier (N7) that generates the amplified signal (output current Io) according to terminal voltage Vb of MOS capacitor N5. The amplified signal generated by amplifier (N7) is used for the final received-light signal (output voltage Vo) to be output.

With such a configuration, anode voltage Va of photo detector PD can be always clamped to the fixed potential (a potential within a rating). Accordingly, reverse bias voltage that does not depend on the amount of received light can be steadily applied to photo detector PD without requiring a process dedicated to suppressing bias dependence.

As such, according to pixel sensor Pmn of the present embodiment, by appropriately adjusting bias voltage VDDPD applied to the cathode of photo detector PD, photo detector PD can be operated with an optimum bias value. This enables, for example, photo current amplification through the avalanche multiplier effect (photo current amplification twenty to one hundred times greater than that in a silicon photodiode), thereby achieving realization of improved light receiving sensitivity and improved S/N ratio of a received-light signal.

In addition, according to pixel sensor Pmn of the present embodiment, the high voltage (bias voltage VDDPD) is applied only to the cathode of photo detector PD to attain the avalanche multiplier effect and the application of the high voltage to the CMOS circuit can be avoided. Hence, insufficiency in breakdown voltage of the CMOS does not present a problem, thus preventing upsizing of the element.

Further, since pixel sensor Pmn of the present embodiment is configured to integrate mirror current Im using MOS capacitor N5 before generating output current Io, fluctuating components and noise components of the light source can be removed.

Furthermore, since pixel sensor Pmn of the present embodiment employs MOS capacitor N5 as means for integrating mirror current Im, the element size reduction and increased capacity can be realized at the same time, as compared with a capacitor that employs floating diffusion.

When terminal voltage Vb applied to the gate of MOS capacitor N5 is below the on-threshold voltage, no channel is formed, resulting in a small capacitance value of MOS capacitor N5. Thus, in utilization of MOS capacitor N5, it is necessary to overcome such a difficulty that its capacitance value varies according to terminal voltage Vb. According to pixel sensor Pmn of the present embodiment, terminal voltage Vb is always maintained higher than the on-threshold voltage of MOS capacitor N5. Hence, a stable capacitance value can be obtained.

Further, since pixel sensor Pmn of the present embodiment employs the cascode current mirror circuit as means for generating mirror current Im from photo current Id, current matching of photo current Id and mirror current Im is increased, thus achieving improved detection accuracy.

Furthermore, as means for generating the amplified signal (output current Io) according to terminal voltage Vb of MOS capacitor N5, pixel sensor Pmn of the present embodiment employs the source follower circuit that uses field-effect transistor N7 having its gate to which terminal voltage Vb of MOS capacitor N5 is input and having its source from which output current Io is drawn. Accordingly, a current output amplifier can be realized very readily and in a small scale.

Next, other embodiments of the present invention will be described with reference to figures. It should be noted that the same or equivalent portions will be given the same reference characters and explanation therefor will not be repeated.

It should be noted that pixel sensor Pmn of each of second to fourth embodiments have substantially the same configuration as that of the first embodiment described above. In view of this, the same components as those in the first embodiment will be given the same reference characters as those in FIG. 2 and explanation therefor will not be repeated. In the following, only characteristic parts in each of the embodiments will be described mainly.

Second Embodiment

Figure 5:
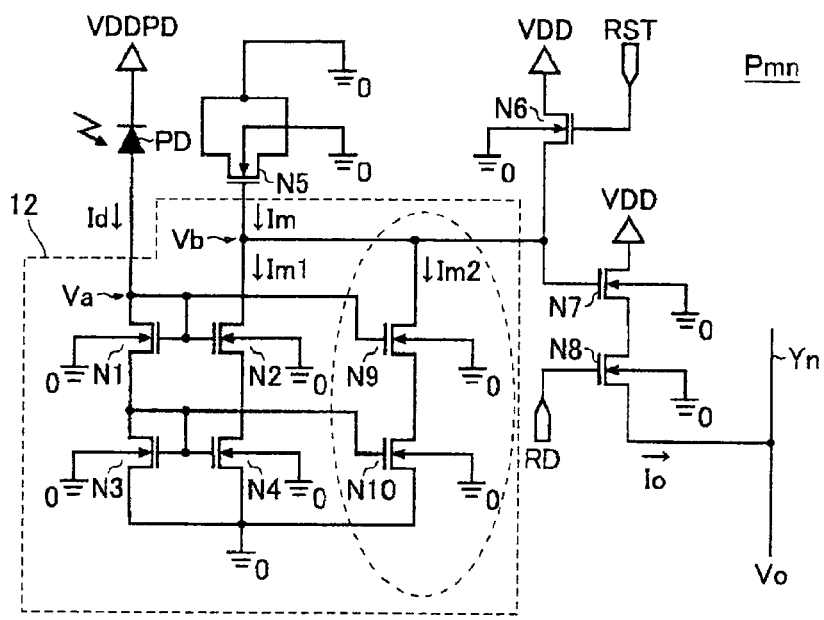
FIG. 5 is a circuit diagram showing a configuration of a pixel sensor Pmn according to a second embodiment of the present invention.

FIG. 5 is a circuit diagram showing a configuration of a pixel sensor Pmn according to a second embodiment of the present invention.

As shown in FIG. 5, in pixel sensor Pmn of the present embodiment, current mirror circuit 12 generating mirror current Im from photo current Id includes the foregoing first mirror stage (transistors N2, N4) and a second mirror stage (transistors N9, N10) encircled by a broken line in the figure. By combining respective current Im1, Im2 generated by the mirror stages, current mirror circuit 12 generates mirror current Im to discharge MOS capacitor N5.

In this way, by increasing the number of mirror stages in the current mirror circuit, photo current Id can be amplified, thereby achieving realization of further improved light receiving sensitivity and further improved S/N ratio of a received-light signal.

Third Embodiment

Figure 6:
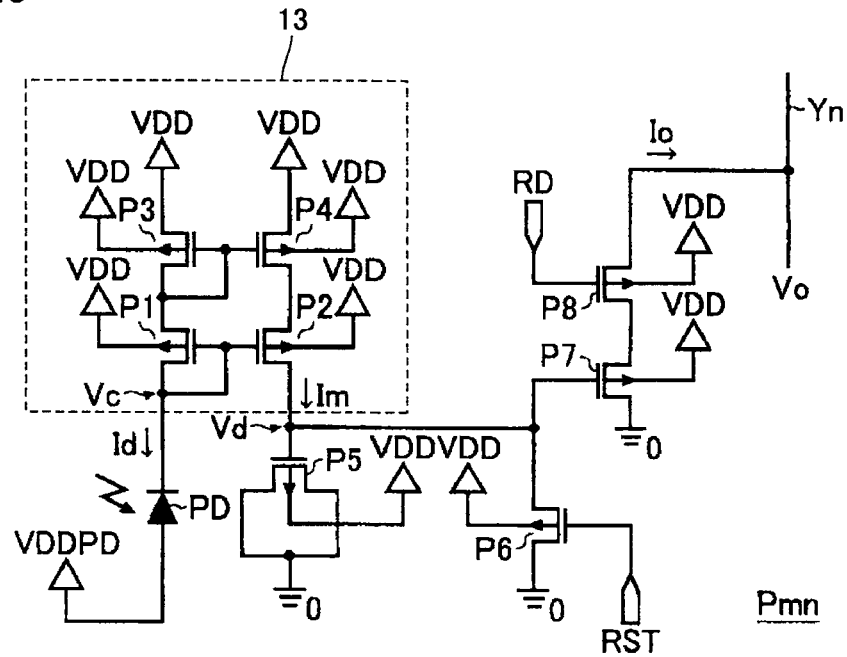
FIG. 6 is a circuit diagram showing a configuration of a pixel sensor Pmn (common anode) according to a third embodiment of the present invention.

FIG. 6 is a circuit diagram showing a configuration of a pixel sensor Pmn (common anode) according to a third embodiment of the present invention.

As shown in FIG. 6, pixel sensor Pmn of the present embodiment includes a photo detector PD, a current mirror circuit 13, and P-channel field-effect transistors P5-P8. Current mirror circuit 13 includes P-channel field-effect transistors P1-P4.

Photo detector PD has an anode to which bias voltage VDDPD (negative voltage of several tens to several hundreds [V]) is applied and has a cathode from which photo current Id according to an amount of received light is output.

Current mirror circuit 13 has an input end connected to the cathode of photo detector PD to clamp cathode voltage Vc of photo detector PD to a predetermined potential (VDD−2× Vth), and generates mirror current Im according to photo current Id.

P-channel field-effect transistor P5 constitutes a MOS capacitor P5 having one end which is connected to the output end of current mirror circuit 13 (end from which mirror current Im is drawn) and from which terminal voltage Vd according to an integral of mirror current Im is drawn.

P-channel field-effect transistor P7 constitutes an amplifier P7 that generates an amplified signal (output current Io) according to terminal voltage Vd of MOS capacitor P5. The amplified signal generated by amplifier P7 is used for a final received-light signal (output voltage Vo) to be output.

As such, the present invention is not only applicable to the configuration (so-called common cathode) in which the cathode of photo detector PD is connected to the common power source end, but also well applicable to the configuration (so-called common anode) in which the anode of photo detector PD is connected to the common end. Thus, even when a silicon photodiode or the like, which provides the common anode configuration, is used as photo detector PD, an advantage similar to that in the first embodiment of the present invention can be obtained.

Exemplified in the description of each of the embodiments above is a case where the present invention is applied to a CMOS image sensor having a two-dimensional matrix structure. However, the present invention is applicable not only to this but also is widely applicable to other solid state imaging devices (photo detectors, line sensors, area sensors, or the like).

In addition, apart from the above-described embodiments, the configuration of the present invention can be modified in various ways without departing from the gist of the invention.

For example, in the description of each of the embodiments, the configurations employing the CIGS solar cell and the silicon photodiode as photo detector PD are exemplified. However, the configuration of the present invention is not limited to these and may employ photoelectric conversion elements such as a phototransistor and an organic photoelectric conversion film.

Exemplified in the description of each of the embodiments is the configuration in which the source follower circuit constituted by the single field-effect transistor is employed as the means for generating the amplified signal (output current Io) according to the terminal voltage of the capacitor. However, the configuration of the present invention is not limited to this and may employ an operational amplifier or the like. With such a configuration, detection accuracy and detection sensitivity can be further improved. Further, if an appropriate signal can be sent to the data lines (column selection lines Y1-Yn), the amplifier is not necessarily required and only the switch for reading can be used.

Further, in the description of each of the embodiments, the configuration employing only the N-channel field-effect transistors is exemplified in the case of the common cathode, whereas the configuration employing only the P-channel field-effect transistors is exemplified in the case of the common anode. However, the configuration of the present invention is not limited to these. The first switch (transistors N6, P6), which is turned on/off in response to reset signal RST, may have polarities reverse to those of the other transistors. With such a configuration, the dynamic range of terminal voltage Vb can be widened although the device scale becomes slightly larger.

In the description of each of the embodiments, the configuration employing the MOS capacitor is exemplified as the means for integrating mirror current Im. However, the configuration of the present invention is not limited to this and can employ a different type of capacitor such as a floating capacitor and a capacitor employing floating diffusion.

In the description of each of the embodiments, the configuration employing the cascode current mirror circuit is exemplified as the means for generating mirror current Im from photo current Id, but the configuration of the present invention is not limited to this. Any configuration can be employed as long as the voltage of the other end of the photoelectric conversion element can be clamped to the predetermined potential and the current matching of photo current Id and mirror current Im can be secured appropriately.

Fourth Embodiment

Figure 7:
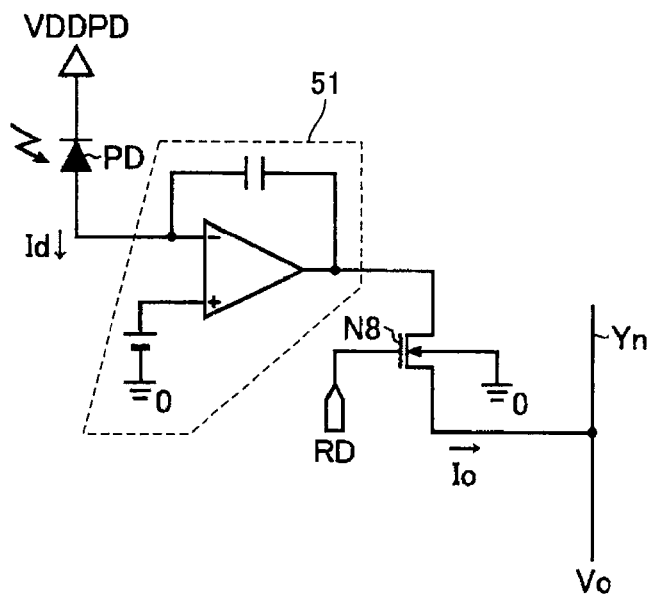
FIG. 7 is a circuit diagram showing a configuration of pixel sensor Pmn (common anode) according to a fourth embodiment of the present invention.
Figure 8:
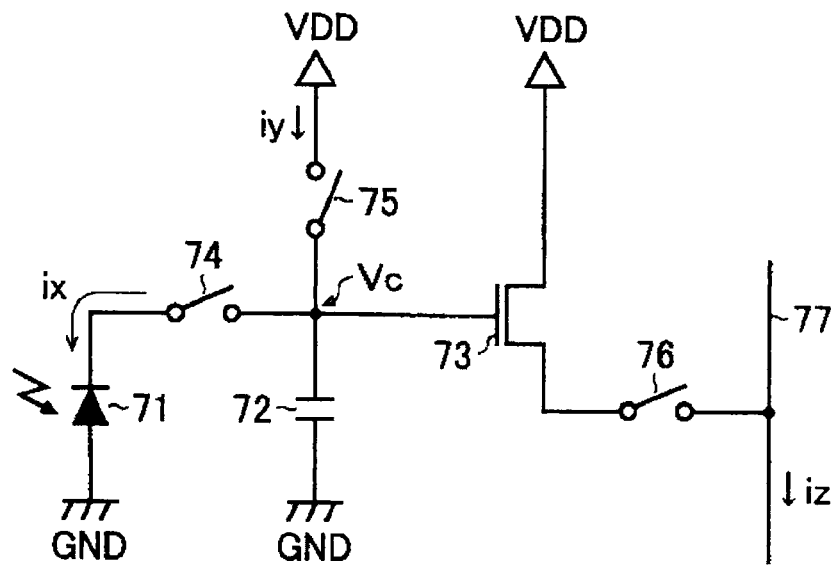
FIG. 8 is a circuit diagram showing one exemplary conventional CMOS photoelectric conversion circuit.
Figure 9:
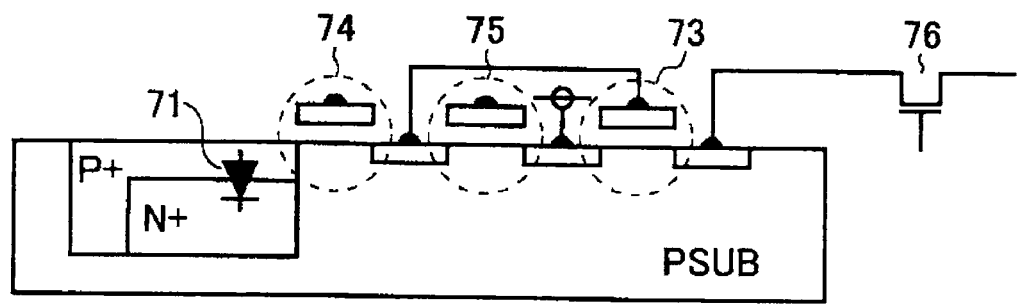
FIG. 9 is a vertical cross sectional view showing a device structure of the exemplary conventional CMOS photoelectric conversion circuit.

FIG. 7 is a circuit diagram showing a configuration of a pixel sensor Pmn (common anode) according to a fourth embodiment of the present invention.

Exemplified in the description of each of the embodiments above is the configuration that employs, as a photo current detecting unit which clamps the anode voltage (or cathode voltage) of photo detector PD to the predetermined potential and detects photo current Id, the current mirror circuit that has the input end connected to the anode (or cathode) of photo detector PD and that generates mirror current Im according to photo current Id. However, the configuration of the present invention is not limited to this. For example, as shown in FIG. 7, an integration circuit 51 connected to the anode (or cathode) of photo detector PD may be employed.

Further, if it is not necessary to integrate photo current Id (or mirror current Im), a resistor may be employed instead of the capacitor constituting the current/voltage conversion unit.

It should be considered that the embodiments disclosed herein are illustrative and non-restrictive in any respect. The scope of the present invention is defined by the scope of claims rather than the description above, and is intended to include any modifications within the scope and meaning equivalent to the terms of the claims.

Industrial Applicability

The present invention provides, for example, a useful technique to achieve improved light receiving sensitivity of a solid state imaging device provided in a mobile phone terminal with a camera function, a web camera, and the like as well as improved S/N ratio of a received-light signal.

What is claimed is:

1. A photoelectric conversion circuit comprising:
 a photoelectric conversion element having one end to which bias voltage is applied and the other end from which photo current according to an amount of received light is output; and
 a photo current detecting unit arranged to clamp voltage of the other end of said photoelectric conversion element to a predetermined potential and to detect said photo current,
 wherein said photo current detecting unit is a cascade current mirror circuit that has an input end connected to the other end of said photoelectric conversion element, that clamps the voltage of the other end of said photoelectric conversion element to the predetermined potential, and that generates mirror current according to said photo current.

2. The photoelectric conversion circuit according to claim 1, wherein said current mirror circuit has a plurality of mirror stages, and combines respective currents generated by said mirror stages, so as to generate said mirror current.

3. The photoelectric conversion circuit according to claim 1, further comprising a current/voltage conversion unit converting said mirror current into voltage.

4. The photoelectric conversion circuit according to claim 3, wherein said current/voltage conversion unit includes a capacitor having one end which is connected to an output end of said current mirror circuit and from which terminal voltage according to an integral of said mirror current is drawn.

5. The photoelectric conversion circuit according to claim 4, wherein said capacitor is a MOS capacitor having a gate connected to the output end of said current mirror circuit.

6. The photoelectric conversion circuit according to claim 4, further comprising an amplifier arranged to generate an amplified signal according to the terminal voltage of said capacitor, wherein based on the amplified signal generated by said amplifier, a final received-light signal is output.

7. The photoelectric conversion circuit according to claim 6, further comprising:
 a first switch that is connected between said one end of said capacitor and an end to which reference voltage is applied and that is turned on/off in response to a reset signal; and
 a second switch that is connected between an output end of said amplifier and an output line and that is turned on/off in response to a read signal.

8. The photoelectric conversion circuit according to claim 6, wherein said amplifier is a source follower circuit that employs a field-effect transistor having a gate receiving the terminal voltage of said capacitor and having a source from which output current is drawn.

9. A solid state imaging device comprising:
 a plurality of photoelectric conversion circuits; and
 a selection circuit arranged to select at least one of the plurality of photoelectric conversion circuits and to acquire a light detection result of the photoelectric conversion circuit thus selected,
 each of said photoelectric conversion circuits including:
  a photoelectric conversion element having one end to which bias voltage is applied and the other end from which photo current according to an amount of received light is output; and
  a photo current detecting unit arranged to clamp voltage of the other end of said photoelectric conversion element to a predetermined potential and to detect said photo current,
 wherein said photo current detecting unit is a cascade current mirror circuit that has an input end connected to the other end of said photoelectric conversion element, that clamps the voltage of the other end of said photoelectric conversion element, that clamps the voltage of the other end of said photoelectric conversion element to the predetermined potential, and that generates mirror current according to said photo current.

\* \* \* \* \*

UNITED STATES PATENT AND TRADEMARK OFFICE
CERTIFICATE OF CORRECTION

PATENT NO.        : 8,537,259 B2  
APPLICATION NO.   : 12/597204  
DATED             : September 17, 2013  
INVENTOR(S)       : Hiroshi Sekiguchi and Takaaki Fuchikami Page 1 of 1

It is certified that error appears in the above-identified patent and that said Letters Patent is hereby corrected as shown below:

In the Claims

Column 11, Line 25, delete "an end" and insert --a node--.

Signed and Sealed this
Tenth Day of June, 2014

Michelle K. Lee
*Deputy Director of the United States Patent and Trademark Office*